(12) United States Patent
Hajimiri et al.

(10) Patent No.: US 6,867,656 B2
(45) Date of Patent: Mar. 15, 2005

(54) SELF-DIVIDING OSCILLATORS

(75) Inventors: Seyed-Ali Hajimiri, Pasadena, CA (US); Hui Wu, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 66 days.

(21) Appl. No.: 10/463,264

(22) Filed: Jun. 17, 2003

(65) Prior Publication Data

US 2004/0008092 A1 Jan. 15, 2004

Related U.S. Application Data

(60) Provisional application No. 60/389,185, filed on Jun. 17, 2002.

(51) Int. Cl.[7] .......................... H03B 5/12; H03B 19/06; H03B 27/00
(52) U.S. Cl. ..................... 331/45; 331/75; 331/117 FE; 331/172; 331/177 V; 327/118; 327/254
(58) Field of Search .............................. 331/45, 74, 75, 331/117 R, 117 FE, 117 D, 172–173, 177 V; 327/115, 117, 118, 238, 254, 255

(56) References Cited

U.S. PATENT DOCUMENTS

4,806,872 A * 2/1989 Cowley ...................... 329/344

OTHER PUBLICATIONS

Search Report for PCT/US03/19146 Dated Dec. 2, 2003 in co–pending PCT filing of U.S. application filed herewith.

Chi et al., "Integrated 2.4 GHz CMOS Quadrature VCO with Symmetrical Spiral Indyctors and Differential Varactors", Institute of Microelectronics, Tsinghua University, Bejing, 100084, China, 2002 IEEE MTT–S Digest, pp. 561–564, XP–001099553.

Lee, et al., "5–GHz CMOS Wireless LANs," IEEE Transactions on Microwave Theory and Techniques, vol. 50, No. 1, Jan., 2002, pp. 268–280, XP–001085549.

Wu et al., "A 19 GHz 0.5Mw 0.35 μm CMOS Frequency Divider with Shunt–Peaking Locking–Range Enhancement," California Institute of Technology, Padadena, California, ISSCC 2001, Session 26, Wireless Building Blocks II, 26.3, pp. 412–413 & 471.

Chi, et al., "Low–Power CMOS VCO and Its Divide–by–2 Dividers with Quadrature Outputs for 5GHZ/2.5GHz WLAN Transceivers", Institute of Microelectronics, Tsinghua University, Bejing, 100084, China, 0–7803–7547–5/02, 2002 IEEE, pp. 525–528.

* cited by examiner

Primary Examiner—David Mis
(74) Attorney, Agent, or Firm—Christopher J. Rourk; Godwin Gruber, LLP

(57) ABSTRACT

A system for generating in-phase and quadrature phase signals is provided. The system includes a first and a second differential output, such as from a sinusoidal oscillator. A first injection-locked frequency divider, such as one that uses an LC oscillator in conjunction with cross-coupled transistors, receives the first differential output and generates a in-phase or in-phase output. A second injection-locked frequency divider receives the second differential output and generates a quadrature phase output.

20 Claims, 3 Drawing Sheets

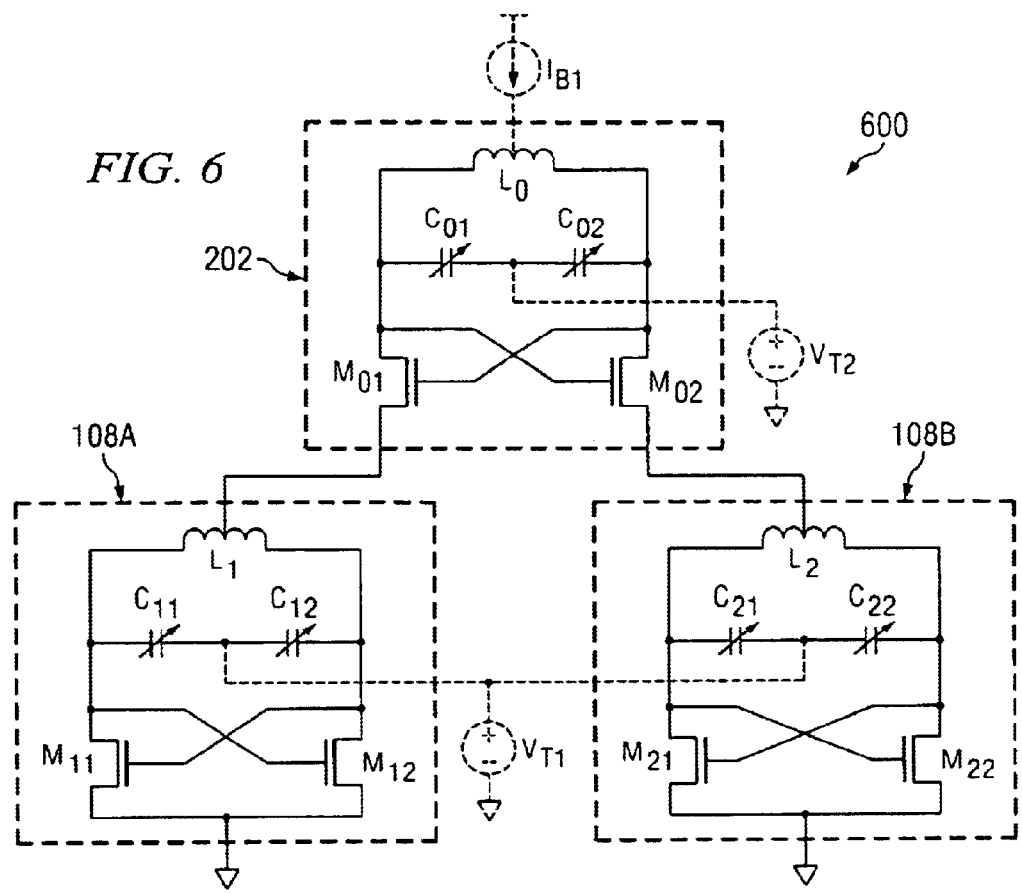
FIG. 6
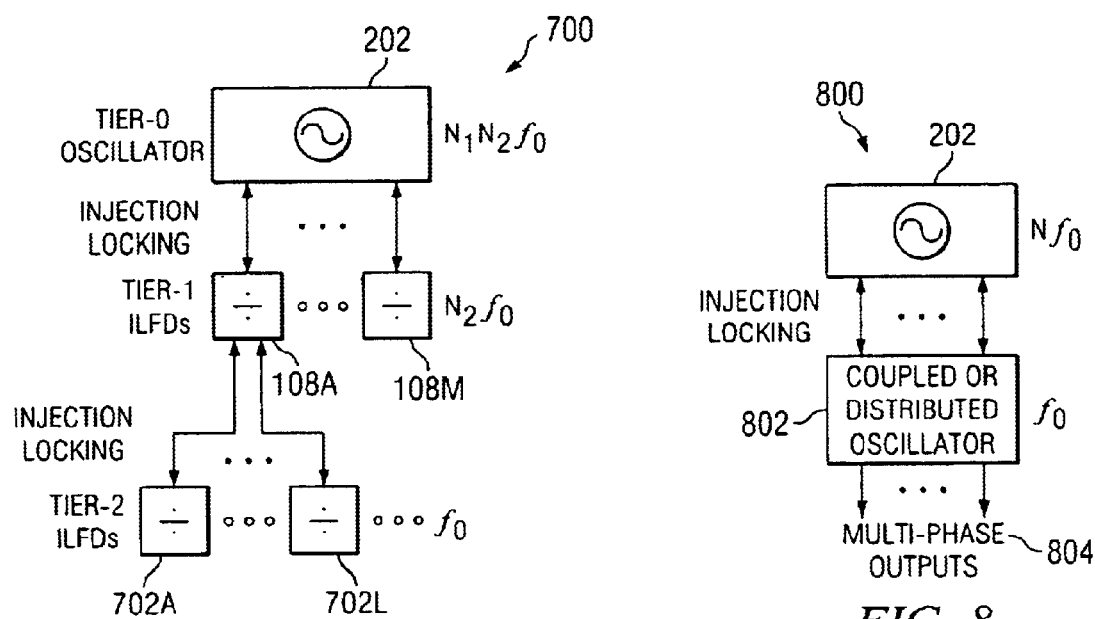
FIG. 7
FIG. 8

SELF-DIVIDING OSCILLATORS

RELATED APPLICATIONS

This application claims priority to U.S. Provisional Application No. 60/389,185, entitled "Ultra-low-noise, multi-phase-output self-dividing oscillators," Hul Wu and Seyed Ali Hajimiri, applicants, filed on Jun. 17, 2002, and which is hereby incorporated by reference for all purposes.

FEDERAL FUNDING STATEMENT

The U.S. Government has rights as provided for by the terms of Grant No. ECS-0083220 awarded by the National Science Foundation.

FIELD OF THE INVENTION

The present invention pertains to oscillators, and more specifically to a self-dividing oscillator with improved efficiency and phase noise performance.

BACKGROUND OF THE INVENTION

Oscillators are building blocks in modern wireless and wireline communications systems. One important factor in designing oscillators is frequency stability, which is usually quantified as phase noise. Phase noise performance is particularly important in oscillators. The phase noise performance of oscillators is a factor in the overall system performance of many communication systems, such as in its effect on interference in adjacent wireless communications channels. Control of phase noise is also of importance in oscillators that are implemented as integrated circuits, such as part of integrated transceivers. The efforts to improve phase noise performance for integrated oscillators have focused on increasing the quality factor, "Q," of the resonator, among other things.

Oscillators are also used to generate in-phase and quadrature-phase output signals. These in-phase and quadrature-phase signals are used for many modern radio architectures. Conventional systems and processes for implementing local oscillators that are used to generate in-phase and quadrature-phase signals include poly-phase filters, coupled oscillators, or digital dividers. Such approaches can result in large power consumption and phase noise degradation.

SUMMARY OF THE INVENTION

In accordance with the present invention, a self-dividing oscillator is provided that can be used to generate in-phase and quadrature phase signals, as well as signals with other phase relationships.

In particular, a self-dividing oscillator is provided that provides improved power efficiency and improved phase noise performance.

In accordance, with an exemplary embodiment of the present invention, a system for generating in-phase and quadrature phase signals is provided. The system includes a first and a second differential output, such as from a sinusoidal oscillator. A first injection-locked frequency divider, such as one that uses an LC oscillator in conjunction with cross-coupled transistors, receives the first differential output and generates an in-phase output. A second injection-locked frequency divider receives the second differential output and generates a quadrature phase output.

The present invention provides many important technical advantages. One important technical advantage of the present invention is a self dividing oscillator that uses injection-locked frequency dividers to provide injection locking, resonant frequency control, increased power efficiency and improved phase noise performance over prior art oscillators.

Those skilled in the art will further appreciate the advantages and superior features of the invention together with other important aspects thereof on reading the detailed description that follows in conjunction with the drawings.

BRIEF DESCRIPTION OF THE SEVERAL VIEWS OF THE DRAWINGS

FIG. 6 is a diagram of a system for providing a delta topology in a self-dividing oscillator in accordance with an exemplary embodiment of the present invention;

FIG. 7 is a diagram of a circuit implementation of a self-dividing oscillator with a delta topology in accordance with an exemplary embodiment of the present invention; and FIG. 8 is a diagram of a system for providing an injection-locked coupled or distributed oscillator to generate multi-phased outputs in accordance with an exemplary embodiment of the present invention.

DETAILED DESCRIPTION OF THE PREFERRED EMBODIMENTS

Figure 1A:
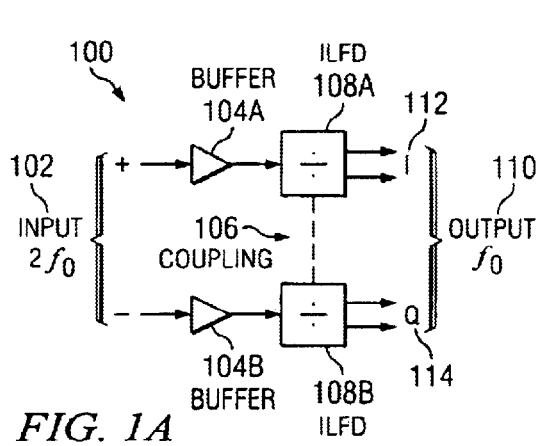
FIG. 1A is a diagram of a system for providing in-phase and quadrature phase signals using injection-locked frequency dividers in accordance with an exemplary embodiment of the present invention.

In the description that follows like parts are marked throughout the specification and drawings with the same reference numerals, respectively. The drawing figures are not necessarily to scale and certain features may be shown in somewhat generalized or schematic form in the interest of clarity and conciseness.

FIG. 1A is a diagram of a system 100 for providing in-phase and quadrature phase signals using injection-locked frequency dividers in accordance with an exemplary embodiment of the present invention. A differential input 102 receives a signal having a frequency of $2 \times f_0$, such as from an oscillator. Buffers 104A and 104B can be used to buffer the input signal. Injection-locked frequency dividers 108a and 108b are then driven by differential input 102 to generate outputs 110 having a free running frequency centered at $f_0$. Injection-locked frequency dividers 108A and 108B can be injection-locked by the input signals. The outputs of injection-locked frequency dividers 108A and 108B can be in quadrature because the input signals are differential and a fixed phase relation can be provided between the injection signal and outputs for the injection-locked frequency dividers.

Because injection-locked frequency dividers 108A and 108B are resonant circuits, they provide for generation of in phase signal 112 and quadrature phase signal 114 at a lower power than other circuits, such as digital dividers or other non-resonant circuits. A resonant circuit dissipates a fraction of the stored energy in each cycle, which is determined by its quality factor, "Q," while a non-resonant circuit consumes the energy stored in parasitic capacitances through charging and discharging. Therefore, the power efficiency of injection-locked frequency dividers 108A and 108B is higher than that of digital dividers or other systems or processes for generating in-phase and quadrature phase signals that are operated at the same frequency. System 100 also provides improved phase noise performance, because injection-locked frequency dividers have higher power efficiency and wide band tracking capability and therefore create smaller phase noise degradation.

Injection-locked frequency dividers 108A and 108B can also take advantage of the non-linearity of circuits and thus provide better in-phase and quadrature phase accuracy. The in-phase and quadrature phase components are not directly coupled, such that the accuracy of the in-phase and quadrature phase components is not affected by device mismatch to the first order. In contrast, digital dividers use flip flop circuits or other systems where the phase accuracy between the in-phase signals and the quadrature phase signals is more vulnerable to mismatch, such as between two flip flop circuits that are used to provide the in-phase and quadrature phase signals in digital dividers.

Figure 1C:
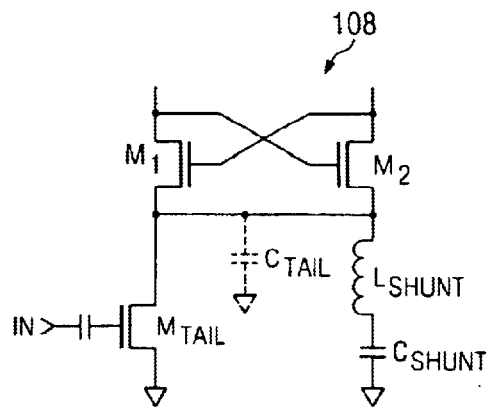
FIGS. 1B AND 1C are exemplary injection-locked frequency dividers in accordance with an exemplary embodiment of the present invention.
Figure 1B:
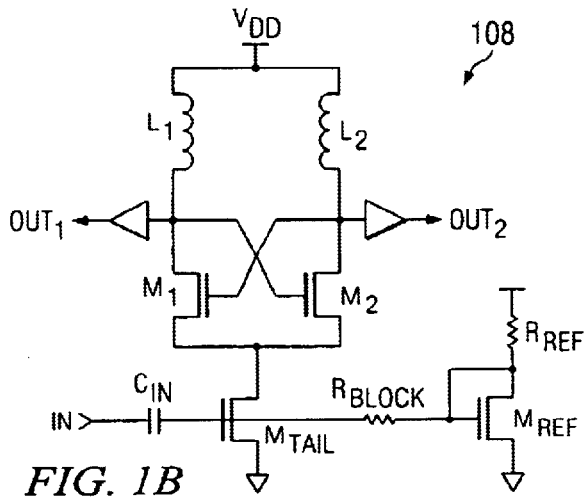

FIGS. 1B AND 1C are exemplary injection-locked frequency dividers 108 in accordance with an exemplary embodiment of the present invention. Injection-locked frequency divider 108 of FIG. 1B provides a differential LC oscillator with a tail node (the drain of the tail transistor, $M_{tail}$) that offers natural frequency doubling. In practice, signals injected into the gate of $M_{tail}$, where the internal injection point is at the tail node which has a large parasitic capacitance $C_{tail}$ consisting of $C_{gd}$ and $C_{db}$ of $M_{tail}$, as well as $C_b$ of $M_1$ and $M_2$. $C_{tail}$ significantly lowers the effective internal injection power which otherwise can be used for injection locking. To remedy the power loss on $C_{tail}$, a shunt inductor $L_{shunt}$ is introduced to resonate $C_{tail}$ at the injection frequency $f_i$. Consequently, the impedance at the tail node increases at $f_i$, and so does the internal injection power. Another way to look at this affect is that $M_{tail}$, $C_{tail}$, and $L_{shunt}$ form a tuned amplifier without output power peaking at $f_i$. This technique can be referred to as shunt peaking locking-range enhancement. A capacitor $C_{shunt}$ in series with $L_{shunt}$ serves as a dc block.

In operation, a shunt peaking injection-locked frequency divider such as that shown in FIG. 1C can be used to compensate for a smaller frequency of range of operation also known as the locking range. Likewise, coherent tuning (such as described in "Superharmonic Injection-Locked Frequency Dividers," *IEEE J. Solid-State Circuits*, vol. 34, no. 6, pp. 813–21, June 1999, H. Rategh and T. H. Lee, which is expressly incorporated by reference for all purposes) or other suitable systems or processes can be used.

In operation, system 100 is used to generate in-phase and quadrature phase signals using injection-locked frequency dividers. System 100 provides in-phase and quadrature phase signals at greater power efficiency, because the injection-locked frequency dividers 108A and 108B are operating in resonance and therefore dissipate less energy than other circuits that consume energy, such as through charging and discharging of parasitic capacitances, or through other parasitic processes.

Figure 2:
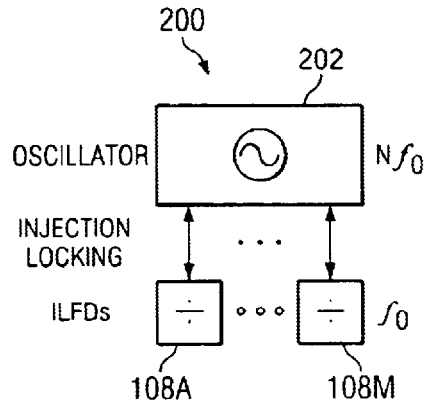
FIG. 2 is a diagram of a system for providing a self dividing oscillator in accordance with an exemplary embodiment of the present invention.

FIG. 2 is a diagram of a system 200 for providing a self dividing oscillator in accordance with an exemplary embodiment of the present invention. System 200 includes oscillator 202 which provides a differential signal to injection-locked frequency dividers IOBA through 108M. Each injection-locked frequency divider 108A through 108M operates at a fundamental frequency $f_0$, while the oscillator 202 has a center frequency at the harmonic frequency $N \times f_0$. System 200 provides a dominant frequency component in each part of the circuit, and can output predetermined frequency components from injection-locked frequency dividers 108A through 108M.

System 200 is more power efficient than a conventional oscillator in a sense that a larger percentage of the direct current power that is typically used to drive the oscillator is converted into an alternating current signal. System 200 thus provides a self-dividing oscillator that can generate multiple phase outputs for a suitable frequency component, such as in-phase and quadrature phase signals. When used in frequency synthesizer applications, system 200 requires much less power consumption than an oscillator plus buffer plus divider configuration or other prior art systems, because both frequency components are readily available from system 200.

System 200 further provides a self dividing oscillator with higher power efficiency that can achieve better phase noise performance than a stand-alone oscillator. Since system 200 takes advantage of the inherent harmonic coupling between the fundamental and harmonic frequencies, it has a larger locking range than a stand-alone injection-locked frequency divider.

Figure 3:
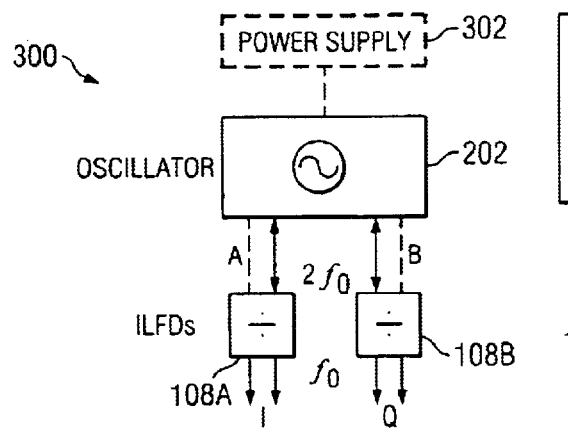
FIG. 3 is a diagram of a system for providing a self dividing oscillator with quadrature outputs in accordance with an exemplary embodiment of the present invention.
Figure 4:
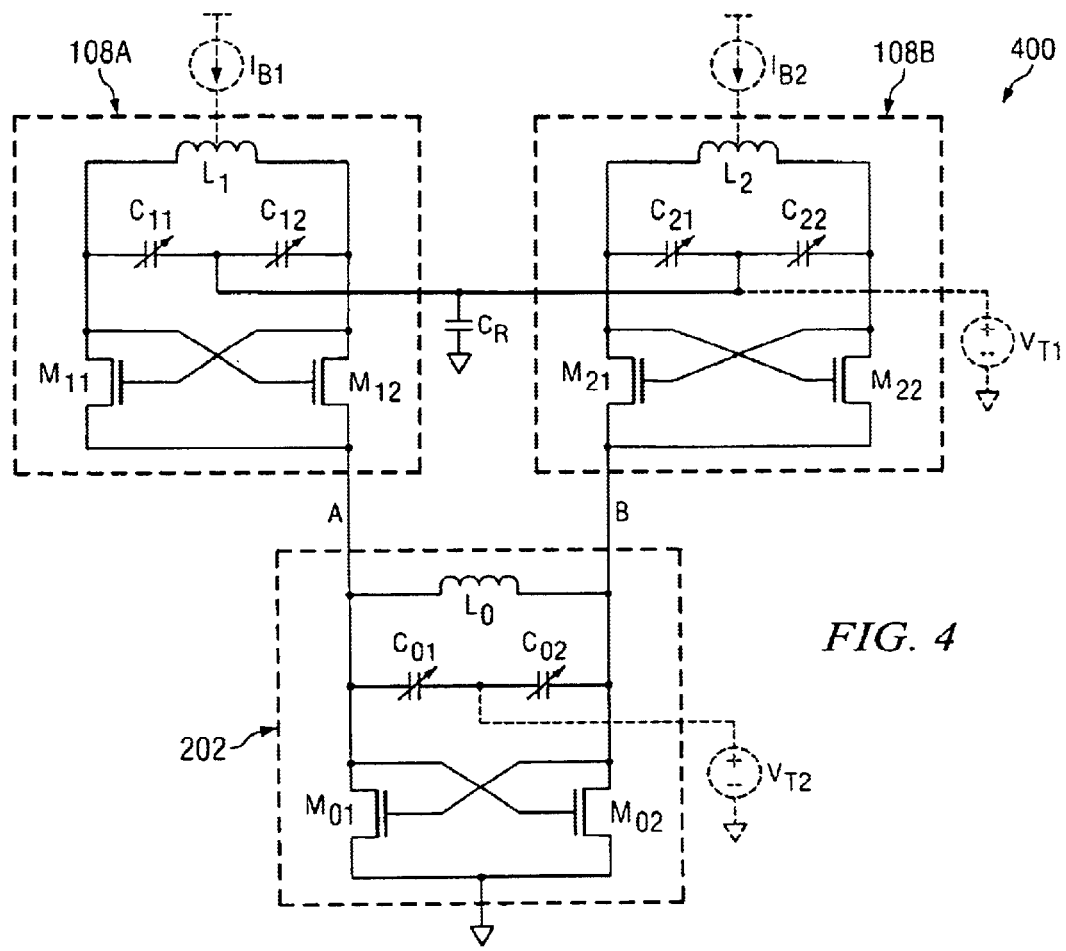
FIG. 4 is a diagram of a circuit implementation of a self-dividing oscillator with quadrature outputs in accordance with an exemplary embodiment of the present invention.

FIG. 3 is a diagram of a system 300 for providing a self dividing oscillator with quadrature outputs in accordance with an exemplary embodiment of the present invention. System 300 includes oscillator 202 and injection-locked frequency dividers 108A and 108B. In one exemplary embodiment, oscillator 202 and injection-locked frequency dividers 108A and 108B can be implemented as LC oscillator cores. For example, oscillator 202 can include a pair of cross coupled transistors $M_{O1}$, and $M_{O2}$ as shown in FIG. 4, a pair varactors $C_{O1}$, and $C_{O2}$, and an inductor $L_O$, $L_O$, $C_{O1}$ and $C_{O2}$ and the capacitances from $M_{O1}$, and $M_{O2}$ form the resonator or LC tank. $M_{O1}$ and $M_{O2}$ also provide negative resistance across the tank to compensate for its loss. The oscillation frequency can be tuned by changing the tuning voltage $v_{t1}$, which is applied to the node at which bypass capacitor $C_r$ is coupled to varactors $C_{11}$, and $C_{12}$ of injection-locked frequency divider 108A and varactors $C_{21}$ and $C_{22}$ of injection-locked frequency divider 108B. Oscillator 202 has differential outputs at nodes A and B. Output buffers can be used for outputs, but are not explicitly shown in FIG. 4.

The center frequency of free running injection-locked frequency dividers 108A and 108B is $f_0$ and the center frequency for oscillator 202 is $2f_0$, where $f_0$ is selected based on the circuit application in which system 400 will be used. Injection-locked frequency dividers 108A and 108B and oscillator 202 are injection-locked at nodes A and B. Bypass capacitor $C_r$ provides a return path for the injected alternating current signal. The differential outputs from injection-locked frequency dividers 108A and 108B can have a phase quadrature relationship. As previously stated, the phase quadrature accuracy is better than conventional approaches using digital dividers or other suitable configurations.

Current coupling can be used for injection locking between oscillator 202 and injection-locked frequency dividers 108A or 108B. Similar to emitter-coupled logic circuits, current coupling can be more efficient at high frequencies than voltage coupling, and improvement in the tuning range can also be provided. Varactors can be provided for oscillator 202 ($C_{01}$ and $C_{02}$), injection-locked frequency divider 108A ($C_{11}$ and $C_{12}$), and injection-locked frequency divider 108B ($C_{21}$ and $C_{22}$), such that coherent tuning can be used to further increase the frequency locking range.

As shown in FIG. 3, the cascode topology enables direct current re-use, where the direct current for oscillator 202 is re-used for injection-locked frequency dividers 108A and 108B. For a given power supply voltage, this leads to lower DC power consumption and increased efficiency. Because of the nature of injection locking and higher power efficiency, self dividing oscillators can achieve a substantial improvement in phase noise performance compared to conventional oscillators.

Figure 5:
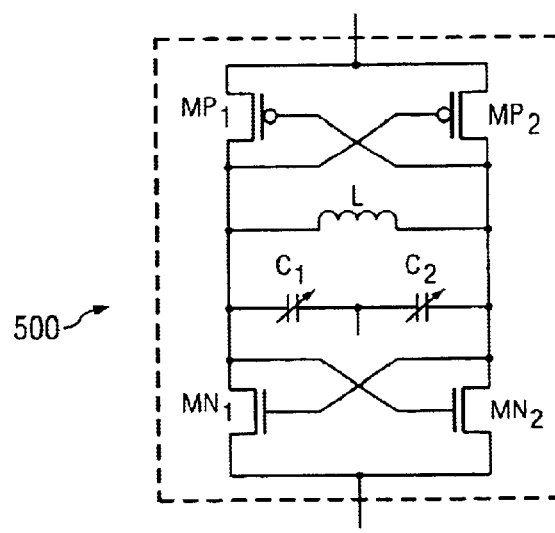
FIG. 5 is a diagram of a system for providing a complementary structure for each LC oscillator core in accordance with an exemplary embodiment of the present invention.

FIG. 5 is a diagram of a system 600 for providing a complementary structure for an LC oscillator core in accordance with an exemplary embodiment of the present invention. Instead of using only NMOS transistors, PMOS transistors pairs are also used to achieve a balanced structure and symmetric wave form. For example, $MN_1$ and $MN_2$ can comprise the NMOS transistors whereas $MP_1$ and $MP_2$ can comprise the PMOS transistors. Inductor L and varactors $C_1$ and $C_2$ are used to provide a balanced structure and symmetrical wave form.

FIG. 6 is a diagram of a system 600 for providing a delta (Δ) topology in a self-dividing oscillator in accordance with an exemplary embodiment of the present invention. System 600 allows signals to be injected directly into the resonator of injection-locked frequency dividers 108A and 108B, and indirectly into that of oscillator 202, while the nabla topology previously disclosed in regards to FIG. 4 does the opposite. In this manner, oscillator 202 can maintain a higher "Q" for its resonator because of less loading and also larger oscillation amplitude because of larger dc headroom. Both factors lead to better phase noise performance for a stand alone oscillator 202 which results in better overall phase noise.

FIG. 7 is a diagram 700 of a circuit implementation of a self-dividing oscillator with a delta topology in accordance with an exemplary embodiment of the present invention. Multiple phase outputs can be generated by expanding the cascode structure further to more tiers. One limiting factor for the multi-tier cascode structure is power supply voltage. In this exemplary embodiment, oscillator 202 operates at a frequency $N_1 \times N_2 \times f_0$. Oscillator 202 is injection-locked to Tier-1 injection-locked frequency dividers 108A through 108M which operate at a frequency $N_2 \times f_0$. Likewise, injection-locked frequency dividers 108A through 108M on Tier-1 are injection-locked to Tier-2 injection-locked frequency dividers 702A through 702L, which operate at a frequency $f_0$. In this manner, a multiple-tier cascode structure can be used to generate multi-phase outputs.

FIG. 8 is a diagram of a system 800 for providing an injection-locked coupled or distributed oscillator 802 to generate multi-phased outputs in accordance with an exemplary embodiment of the present invention. In this exemplary embodiment, oscillator 202 operates at a frequency of $N \times f_0$ and is injection-locked to a coupled or distributed oscillator 802 operating at a frequency $f_0$. Multiphase outputs 804 are provided that allow the exact phase relationship between the outputs of the coupled or distributed oscillator can be maintained. Injection locking can also be used to improve phase noise performance in this exemplary configuration.

Although the description above is based on terminologies expressed in CMOS technologies, self dividing oscillators can also be implemented using other technologies, such as bipolar junction transistors, SiGe, BiCMOS, III–V semiconductor technologies, or other suitable architectures.

Although exemplary embodiments of a system and method of the present invention have been described in detail herein, those skilled in the art will also recognize that various substitutions and modifications can be made to the systems and methods without departing from the scope and spirit of the appended claims.

What is claimed is:

1. A system for generating in-phase and quadrature phase signals comprising:
   a first and a second differential output;
   a first injection-locked frequency divider receiving the first differential output and generating a in-phase phase output; and
   a second injection-locked frequency divider receiving the second differential output and generating a quadrature phase output.

2. The system of claim 1 wherein the first and second differential output operates at a frequency $f_0$ and the first injection-locked frequency divider operates at a frequency $f_0/2$.

3. The system of claim 2 wherein the second injection-locked frequency divider operates at a frequency $f_0/2$.

4. The system of claim 1 wherein the first injection-locked frequency divider is a coherent-tuning injection-locked frequency divider.

5. The system of claim 1 wherein the first injection-locked frequency divider is a shunt-peaking injection-locked frequency divider.

6. The system of claim 1 wherein one or more injection-locked frequency divider further comprises complementary transistors.

7. A self dividing oscillator comprising:
   an oscillator operating at a frequency $N \times f_0$, where N is an integer and $f_0$ is a fundamental frequency, the oscillator generating a first and a second differential output;
   a first injection-locked frequency divider receiving the first differential output and generating a first phase output; and
   a second injection-locked frequency divider receiving the second differential output and generating a second phase output.

8. The self-dividing oscillator of claim 7 wherein the first injection-locked frequency divider operates at the frequency $f_0$.

9. The self-dividing oscillator of claim 7 wherein the first injection-locked frequency divider comprises an LC oscillator core.

10. The self-dividing oscillator of claim 7 wherein the oscillator comprises an LC oscillator core.

11. The self-dividing oscillator of claim 10 wherein the oscillator further comprises;
    a first three terminal device having a control terminal, a first conducting terminal, and a second conducting terminal;
    a second three terminal device having a control terminal, a first conducting terminal, and a second conducting terminal;

the first conducting terminal of the first three terminal device coupled to the control terminal of the second three terminal device;

the first conducting terminal of the second three terminal device coupled to the control terminal of the second three terminal device;

the first conducting terminal of the first three terminal device coupled to a first terminal of the LC oscillator core;

the first conducting terminal of the second three terminal device coupled to a second terminal of the LC oscillator core;

the first differential output provided at the first conducting terminal of the first three terminal device; and the second differential output provided at the first conducting terminal of the second three terminal device.

12. The self-dividing oscillator of claim 11 wherein the LC oscillator core of the oscillator further comprises a first varactor coupled to the first conducting terminal of the first three terminal device and a power source, and a second varactor coupled to the first conducting terminal of the second three terminal device and the power source.

13. The self-dividing oscillator of claim 7 wherein one or more injection-locked frequency divider further comprises complementary transistors.

14. The self-dividing oscillator of claim 7 wherein one or more injection-locked frequency divider further comprises a coherent-tuning injection-locked frequency divider.

15. The self-dividing oscillator of claim 7 wherein one or more injection-locked frequency divider further comprises a shunt-peaking injection-locked frequency divider.

16. The self-dividing oscillator of claim 7 further comprising a delta topology.

17. A self dividing oscillator comprising:

an oscillator operating at a frequency $N \times f_0$, where N is an integer and $f_0$ is a fundamental frequency, the oscillator generating a first and a second output;

a first injection locked frequency divider receiving the first output and generating a first phase output;

a second injection locked frequency divider receiving the second output and generating a second phase output; and wherein the first phase output and the second phase output have a predetermined phase relationship.

18. The self-dividing oscillator of claim 17 wherein the first injection locked frequency divider operates at the frequency $f_0$.

19. The self-dividing oscillator of claim 17 wherein the first injection locked frequency divider comprises an LC oscillator core.

20. The self-dividing oscillator of claim 17 further comprising a third injection locked frequency divider receiving a third output and generating a third phase output at a frequency $1/M \times f_0$, where M is an integer.

* * * * *

UNITED STATES PATENT AND TRADEMARK OFFICE
CERTIFICATE OF CORRECTION

PATENT NO. : 6,867,656 B2
DATED : March 15, 2005
INVENTOR(S) : Hajimiri et al.

It is certified that error appears in the above-identified patent and that said Letters Patent is hereby corrected as shown below:

Column 6,
Line 22, delete "a" and insert -- an --.
Line 28, delete "operates" and insert -- operate --.
Line 61, delete "comprises;" and insert -- comprises: --.

Column 7,
Line 5, delete "first" and insert -- second --.

Signed and Sealed this

Twenty-second Day of November, 2005

JON W. DUDAS
*Director of the United States Patent and Trademark Office*